US 6,590,913 B1

(12) United States Patent
Caras et al.

(10) Patent No.: US 6,590,913 B1
(45) Date of Patent: Jul. 8, 2003

(54) BARRIER LAYER AND METHOD OF MAKING THE SAME

(75) Inventors: Bernard Caras, Princeton, NJ (US); David G. Coult, Bechtelsville, PA (US); Gustav E. Derkits, New Providence, NJ (US); Charles Lentz, Sinking Springs, PA (US); Debra L. Waltemyer, Upper Providence Township, PA (US)

(73) Assignee: TriQuint Technology Holding Co., Hillsboro, OR (US)

( * ) Notice: Subject to any disclaimer, the term of this patent is extended or adjusted under 35 U.S.C. 154(b) by 0 days.

(21) Appl. No.: 09/312,435

(22) Filed: May 14, 1999

(51) Int. Cl.$^7$ .............................. H01S 3/04; H01L 23/48
(52) U.S. Cl. ........................ 372/36; 257/772; 257/753
(58) Field of Search ........................ 372/36, 43, 44, 372/45, 46; 257/772, 753; 428/620, 622, 637, 669, 670, 672

(56) References Cited

U.S. PATENT DOCUMENTS 5,559,817 A  9/1996  Derkits, Jr. et al. ............ 372/36
5,877,031 A  3/1999  Jang et al. .................... 427/528
5,885,898 A  3/1999  Kim et al. ..................... 438/663
6,222,863 B1 * 4/2001  Derkits, Jr. et al. ............ 372/43

FOREIGN PATENT DOCUMENTS

JP   61097890   * 5/1986   ............. H01S/3/18

OTHER PUBLICATIONS

English language abstract of JP–61–097890 A, Fujitsu, taken from the Japanese Patent Office. May 1986.*

* cited by examiner

Primary Examiner—Quyen Leung
(74) Attorney, Agent, or Firm—Thomas, Kayden, Horstemeyer & Risley, LLP

(57) ABSTRACT

A barrier layer is formed within a microfabricated device, such as a semiconductor laser assembly. The barrier layer is used to separate bonding material from an underlying layer that is located beneath the barrier layer. The barrier layer includes at least three thin layers that have alternating levels of electronegativity. Therefore, a significant amount of intermetallics are formed between the thin layers, thereby creating strong bonds between the thin layers at relatively low temperatures. It is difficult for the bonding material to break the strong bonds of the thin layers, and the bonding material is, therefore, prevented from penetrating the barrier layer and reacting with the underlying layer.

24 Claims, 7 Drawing Sheets

BARRIER LAYER AND METHOD OF MAKING THE SAME

BACKGROUND OF THE INVENTION

1. Field of the Invention

The present invention generally relates to production of microfabricated devices and, in particular, to a system and method for reducing contamination within a microfabricated device by preventing bonding material from dissolving with layers within the device.

2. Related Art

Some conventional microfabricated devices, such as semiconductor laser assemblies, include a compliant layer that can move or deform to absorb mechanical strain. In this regard, different layers of a typical microfabricated device usually have different thermal expansion properties and, therefore, expand/contract differently when exposed to temperature variations. The difference in thermal expansion and/or contraction creates mechanical strain within the microfabricated device. The compliant layer is usually comprised of a soft material, such as gold (Au), so that it can deform to absorb the mechanical strain. U.S. Pat. No. 5,559,817 entitled "Compliant Layer Metallization," and filed by Derkits, Jr., et al. on Nov. 23, 1994, which is incorporated herein by reference, fully discusses utilization of a compliant metallization layer to absorb mechanical strain within microfabricated devices.

Since one of the primary purposes of the compliant layer is to absorb mechanical strain, it is important to ensure that the mechanical properties of the compliant layer remain unaltered by protecting the chemical integrity of the compliant layer. However, it is possible for the compliant layer to become contaminated when components are bonded to the microfabricated device. In this regard, it is possible for a bonding material, such as a solder, to react with (i.e., contaminate) the elements of the compliant layer, if the bonding material is allowed to contact the compliant layer. Contamination of the compliant layer can harden the compliant layer, thereby making it more difficult for the compliant layer to absorb mechanical strain. Consequently, it is common to couple a thick barrier layer to the compliant layer. The thick barrier layer separates the compliant layer from the bonding material in order to protect the chemical integrity of the compliant layer.

Furthermore, in many applications it is also important to maintain the thermal and/or electrical conductivity of the compliant layer and/or other layers in the microfabricated device. However, reaction with the bonding material can adversely affect the thermal and/or electrical conductivity of the layers of the device. Therefore, by preventing the bonding material from reacting with the layers underlying the barrier layer, the barrier layer is also used to protect the thermal and/or electrical conductivity of the device.

However, many conventional barrier layers begin to dissolve during long (or sequential) annealing processes and/or at relatively high temperatures, thereby allowing the bonding material to react with and contaminate the compliant layer and/or other layers underlying the barrier layer. Therefore, the chemical integrity and/or the transport properties (i.e., the thermal and/or electrical conductivity) of the layer(s) beneath the barrier layer are adversely affected.

Another problem that occurs when the barrier layer is dissolved by the bonding material is contamination of the bonding material. In this regard, the melting temperature of the bonding material is usually affected as the material of the barrier layer and/or layers residing underneath the barrier layer are dissolved into the bonding material. As a result, the bonding material may solidify before a bond is fully formed thereby reducing the quality of the bond.

Thus, a heretofore unaddressed need exists in the industry for a more robust barrier layer that resists dissolving with bonding material to protect the chemical integrity of the bonding material and to protect the chemical integrity and/or the transport properties of underlying layers during bonding at relatively high temperatures and/or for relatively long or sequential bonding periods.

SUMMARY OF THE INVENTION

The present invention overcomes the inadequacies and deficiencies of the prior art as discussed herein. The present invention is a system and method for preventing bonding material from contaminating layers within a microfabricated device.

The present invention utilizes a barrier layer to separate bonding material from an underlying layer that is located beneath the barrier layer. The barrier layer includes at least three thin layers that have alternating levels of electronegativity. Therefore, a significant amount of intermetallics are formed between the thin layers, thereby creating strong bonds between the thin layers at relatively low temperatures. It is difficult for the bonding material to break the strong bonds of the thin layers, and the bonding material is, therefore, prevented from penetrating the barrier layer and reacting with the underlying layer.

The present invention can also be viewed as providing a method for manu-facturing a microfabricated device. Briefly described, the method can be broadly conceptualized by the following steps: providing a substrate; forming a barrier layer; and forming an underlying layer between the substrate and the barrier layer. The forming of a barrier layer step includes the steps of: forming a first layer on a second layer; forming a third layer on the second layer; and selecting a respective thickness for each of the first, second, and third layers such that intermetallics form throughout the first, second, and third layers.

The present invention has many advantages, a few of which are delineated hereafter, as mere examples.

An advantage of the present invention is that bonding material is prevented from contacting and reacting with layers of a microfabricated device that are located beneath a barrier layer. Therefore, the bonding material is prevented from contaminating the layers located beneath the barrier layer.

Another advantage of the present invention is that evaporation techniques may be used to form a barrier layer within a microfabricated device.

Another advantage of the present invention is that intermetallics may be formed throughout a barrier layer within a microfabricated device.

Another advantage of the present invention is that high temperatures and/or long (or sequential) bonding process may be applied to a microfabricated device without contaminating the material of the device.

Another advantage of the present invention is that contamination of bonding material used to bond components of a microfabricated device can be reduced or prevented.

Other features and advantages of the present invention will become apparent to one skilled in the art upon examination of the following detailed description, when read in

BRIEF DESCRIPTION OF THE DRAWINGS

The invention can be better understood with reference to the following drawings. The elements of the drawings are not necessarily to scale relative to each other, emphasis instead being placed upon clearly illustrating the principles of the invention. Furthermore, like reference numerals designate corresponding parts throughout the several views.

DETAILED DESCRIPTION OF THE INVENTION

Figure 1:
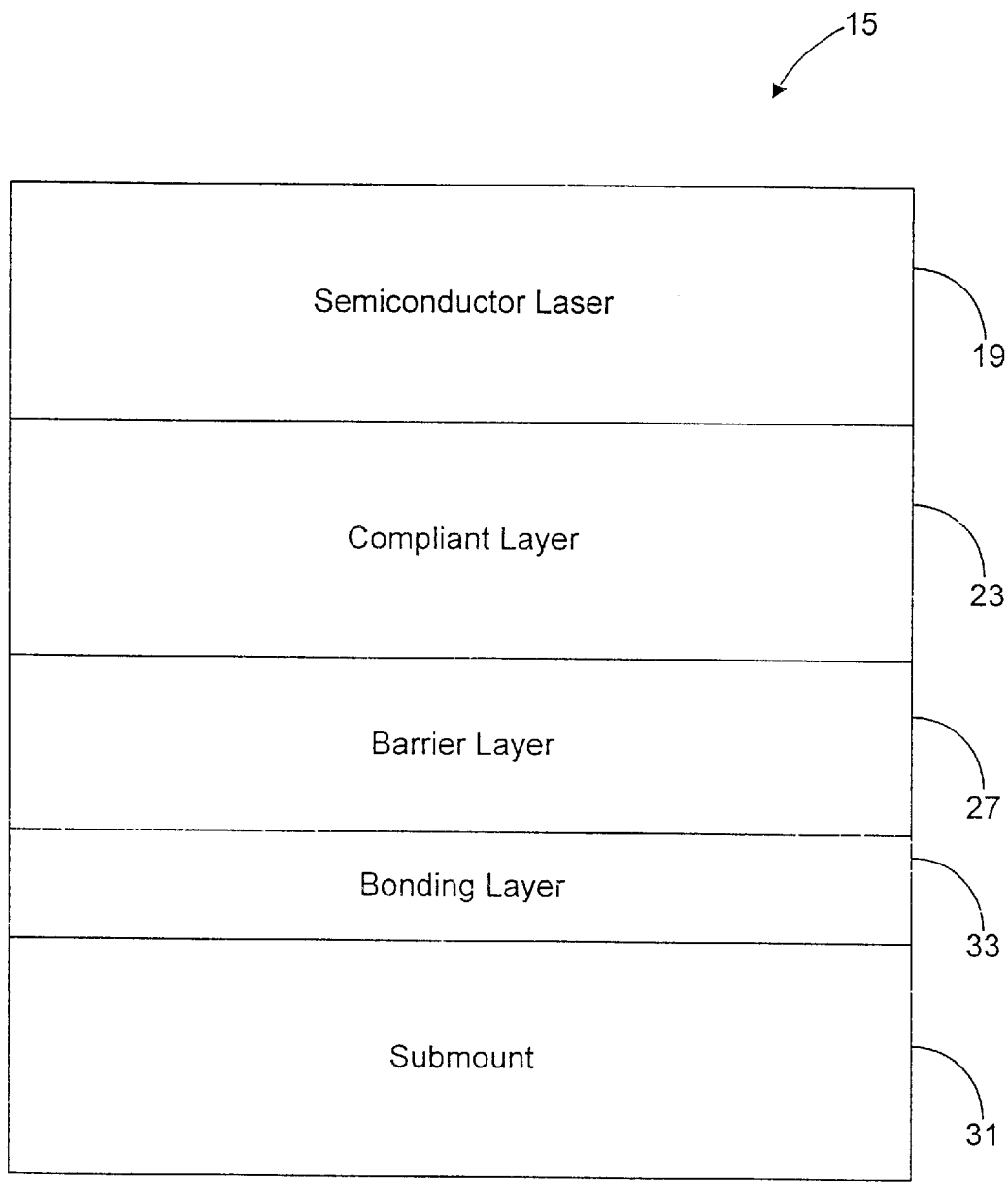
FIG. 1 is a block diagram illustrating a conventional semiconductor laser assembly.

FIG. 1 shows a conventional semiconductor laser assembly 15. The assembly 15 includes a semiconductor laser 19 coupled to a compliant layer 23. The compliant layer 23 is coupled to a barrier layer 27, which is coupled to a submount 31 via a solder bonding layer 33. The submount 31 may include circuitry, such as optical waveguides for transmitting light generated by the laser 19. The compliant layer 23 is comprised of a soft, pliable material, such as gold (Au), so that the compliant layer 23 may deform due to mechanical strain in the assembly 15. Therefore, the compliant layer 23 absorbs mechanical strain produced from mechanical and thermal forces exerted on the assembly 15.

Figure 2:
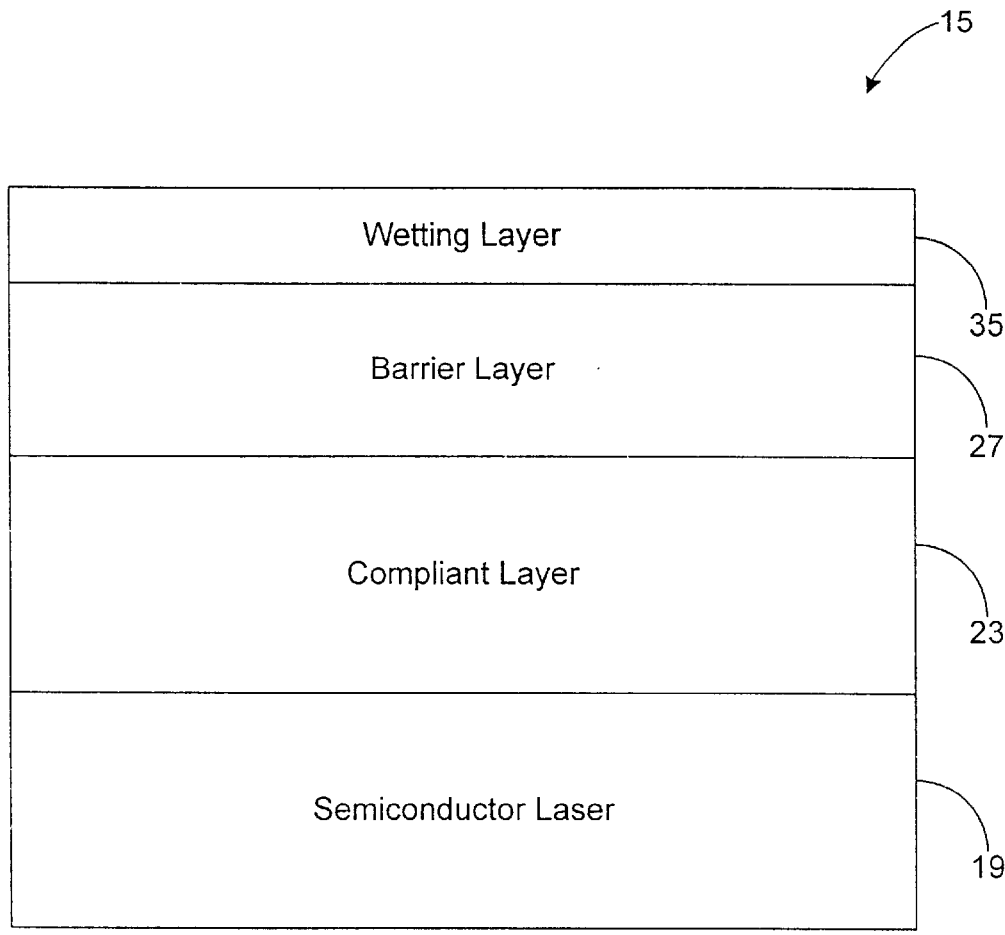
FIG. 2 is a block diagram illustrating the conventional semiconductor laser assembly of FIG. 1 before the submount is bonded to the assembly.

In manufacture of the assembly 15, the compliant layer 23 is initially formed on the semiconductor laser 19. Then, the barrier layer 27 is applied to the compliant layer via a plating process. Typically, the barrier layer 27 is comprised of a single element such as platinum (Pt), for example. Referring to FIG. 2, a wetting layer 35 is then applied to the barrier layer 27 to ensure adequate wetting during the bonding of the submount 31 to the assembly 15. As an example, the wetting layer 35 can be comprised of gold (Au).

A solder material such as a gold-tin (Au—Sn) compound is applied to the wetting layer 35, and the wetting layer 35 diffuses with the solder material to form the bonding layer 33 (FIG. 1). The submount 31 is attached to the bonding layer 33 as the solder material is diffusing with the material of the wetting layer 35. When the bonding layer 33 hardens, the submount 31 is mechanically attached to the bonding layer 33 and, therefore, to the assembly 15.

Ideally, the barrier layer 27 separates the solder material from the compliant layer 23, thereby preventing contamination of the compliant layer 23. As described hereinbefore in the Background section, it is important for the compliant layer 23 to remain pure in order to ensure that the mechanical properties of the compliant layer 23 adequately absorb the mechanical strain of the assembly 15 and to ensure that the thermal and/or electrical conductivity of any layers underlying the barrier layer 27 (such as the compliant layer 23, for example) are not adversely affected.

However, during bonding of the submount 31 to the assembly 15, the bonding material usually begins to diffuse with and dissolve the barrier layer 27. Depending on the duration of bonding and the temperatures used during the bonding, it is possible for the bonding material applied to the wetting layer 35 (FIG. 2) to dissolve through both the wetting layer 35 and the barrier layer 27 and to begin reacting with and contaminating the compliant layer 23 and/or other layers between the barrier layer 27 and the semiconductor laser 19.

Figure 3:
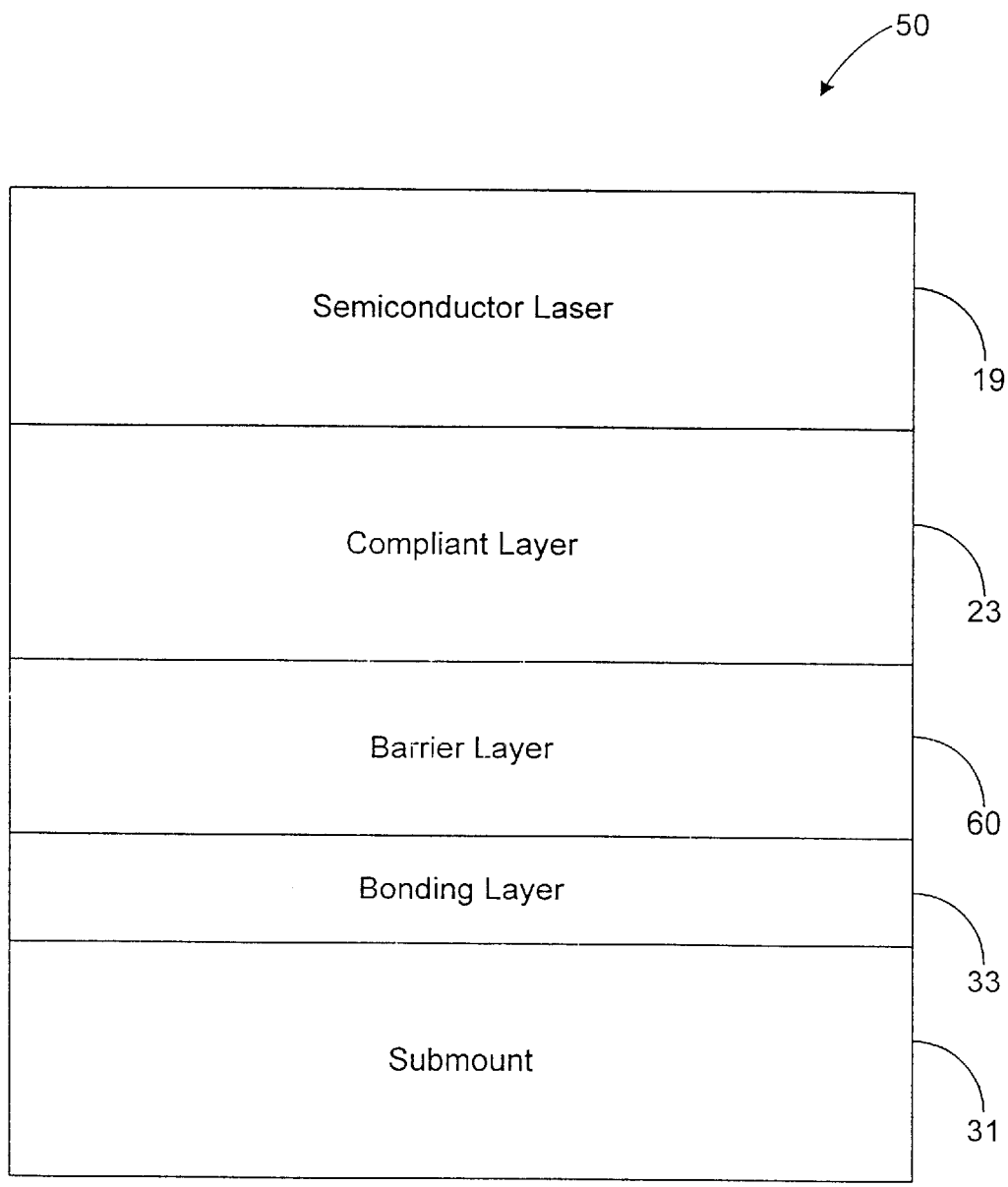
FIG. 3 is a block diagram illustrating the semiconductor laser assembly of the present invention.

In general, the present invention provides a microfabricated semiconductor laser assembly with an improved barrier layer that adequately protects the compliant layer 23 and/or other layers at higher temperatures and longer bonding durations than conventional barrier layers 27. The term "microfabricated" or "microfabrication" in a broad sense "describes one of many precision engineering disciplines . . . for creating small three-dimensional (3D) structures with dimensions ranging from subcentimeters to submicrometers, involving sensors, actuators, or other microcomponents and microsystems." M. Madou, Fundamentals of Microfabrication, CRC Press (1997). FIG. 3 depicts a semiconductor laser assembly 50 manufactured in accordance with the principles of the present invention. Assembly 50, similar to conventional assembly 15, includes a semiconductor laser 19 coupled to a compliant layer 23, which absorbs mechanical strain in the assembly 50. The compliant layer 23 is coupled to a barrier layer 60, which prevents contamination of the compliant layer 23. A submount 31 is attached to the barrier layer 60 via bonding layer 33. However, unlike conventional barrier layer 27, barrier layer 60 of the present invention is comprised of a plurality of thin layers that are diffused together, as will be discussed in further detail hereinbelow.

Figure 4:
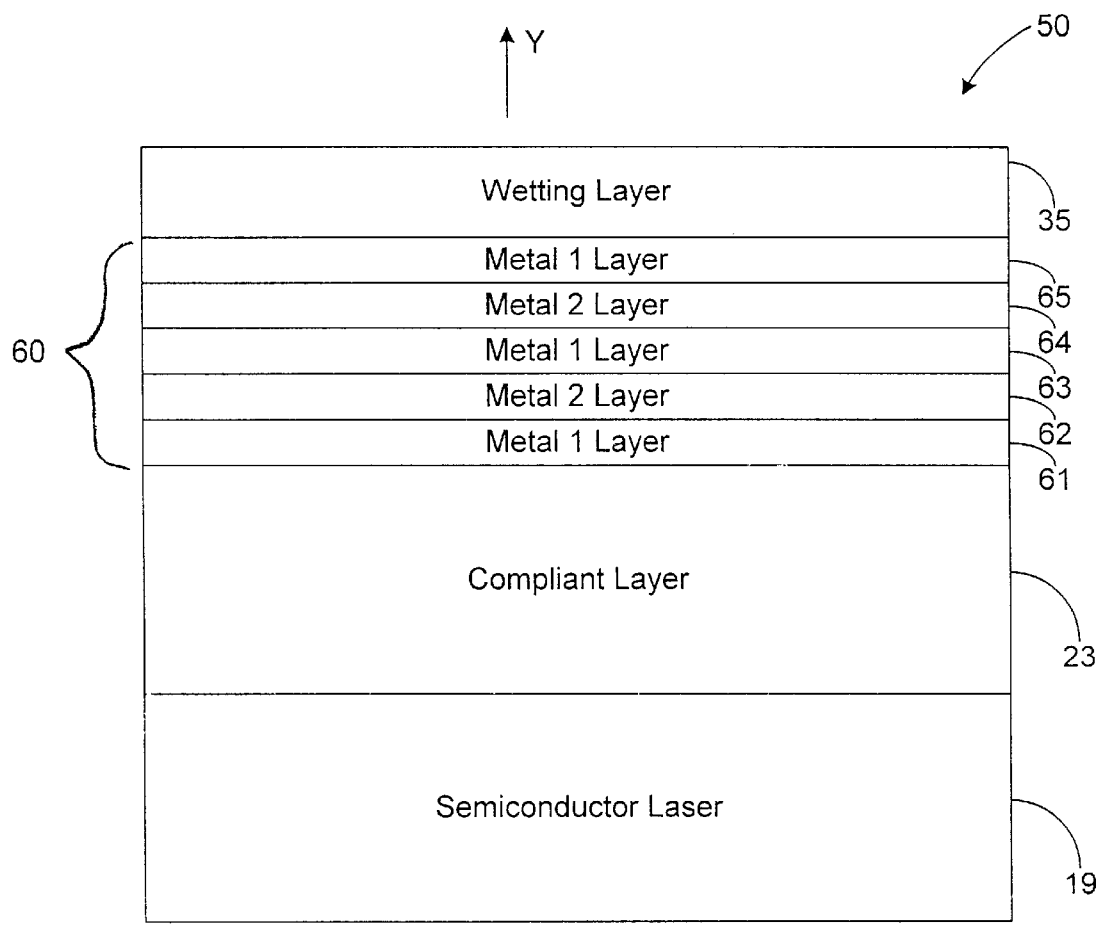
FIG. 4 is a block diagram illustrating the semiconductor laser assembly of FIG. 3 before the submount is bonded to the assembly.

Referring to FIG. 4, the semiconductor laser 19 is initially attached to the compliant layer 23. In the preferred embodiment, the compliant layer 23 is comprised of gold (Au), although other elements or compounds may be used. Next, the barrier layer 60 is formed on the compliant layer 23. In this regard, a plurality of layers 61–65 are successively formed via plating, evaporation, sputtering or other suitable process(es). In the preferred embodiment, alternating layers 61–65 are comprised of the same element. For example, layers 61, 63, and 65 are comprised of one element, and layers 62 and 64 are comprised of a different element. Furthermore, the two elements are preferably chosen such that strong bonds will form between the layers 61–65 when the layers 61–65 are heated. In other words, the two elements should be chosen such that formation of intermetallics in the barrier layer 60 is promoted. Therefore, one of the elements chosen should have a relatively low electronegativity, and the other element chosen should have a relatively high electronegativity.

As known in the art, "electronegativity" is a measure of the power of an atom, when in a molecule, to attract electrons to itself. In other words, "electronegativity" corresponds to the average electron energy of the valence shell electrons in the ground state of an atom. Generally, the greater the difference in the electronegativities, the stronger will be the bonds that form between the layers 61–65. As an example, titanium (Ti) and ytterbium (Y) with respective electronegativities of 1.54 and 1.22 on the well known Pauling scale of electronegativities are suitable as elements of low electronegativity, and platinum (Pt) and palladium (Pd) with respective electronegativities of 2.28 and 2.20 on the Pauling scale are suitable as elements of high electronegativity.

In general, elements having Pauling electronegativity values greater than approximately 2.0 are considered to be elements of high electronegativity, and elements having Pauling electronegativity values less than approximately 1.7 on the Pauling scale of electronegativities are considered to be elements of low electronegativity. In the preferred embodiment, layers 61, 63, and 65 are comprised of platinum (Pt), and layers 62 and 64 are comprised of titanium (Ti). However, it is possible in other embodiments to replace all or some of the layers 61, 63, and 65 with other element(s) having high electronegativity, and it is possible to replace all or some of the layers 62 and 64 with other element(s) having low electronegativity. Examples of other elements having a high electronegativity are, but are not limited to, nickel (Ni), cobalt (Co), platinum (Pt), and/or palladium (Pd), and examples of other elements having a low electronegativity are, but are not limited to, any element from the group of Lanthanide rare earth elements. Furthermore, it is also possible for layers 62 and 64 to be comprised of an element (s) having high electronegativity as long as layers 61, 63, and 65 are comprised of an element(s) having low electronegativity.

Using layers 61–65 of alternating electronegativities, in addition to promoting the formation of intermetallics, also promotes the formation of small crystallites in the barrier layer 60. Furthermore, the barrier layer 60 is likely to have variable chemical qualities due to differences in the mole fractions of the different layers 61–65. Each of these features (i.e., promotion of intermetallics, promotion of small crystallites, and differences in mole fractions) makes it more difficult for a bonding material to dissolve the barrier layer 60 and, therefore, to react with and contaminate the compliant layer 23.

Once layers 61–65 have been formed, the assembly 50 is annealed via a suitable annealing process to diffuse the layers 61–65 together. Accordingly, the layers 61–65 are diffused into an intermetallic compound. To maximize the formation of intermetallics, it is preferable that the thickness (i.e., the length in the y-direction) of each of the layers 61–65 be limited.

Figure 5A:
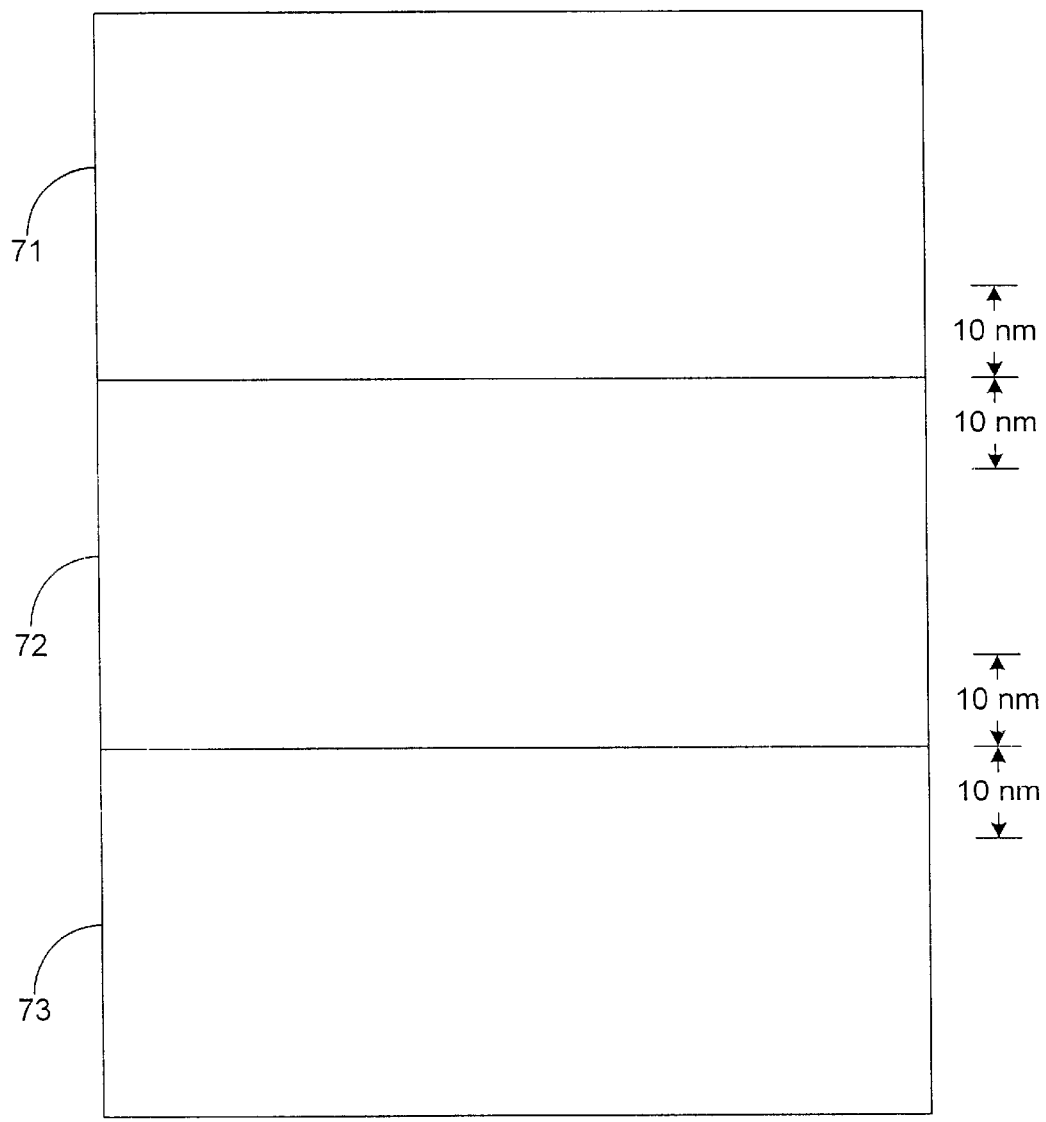
FIG. 5A is a block diagram illustrating three layers before intermetallics are formed in the layers.
Figure 5B:
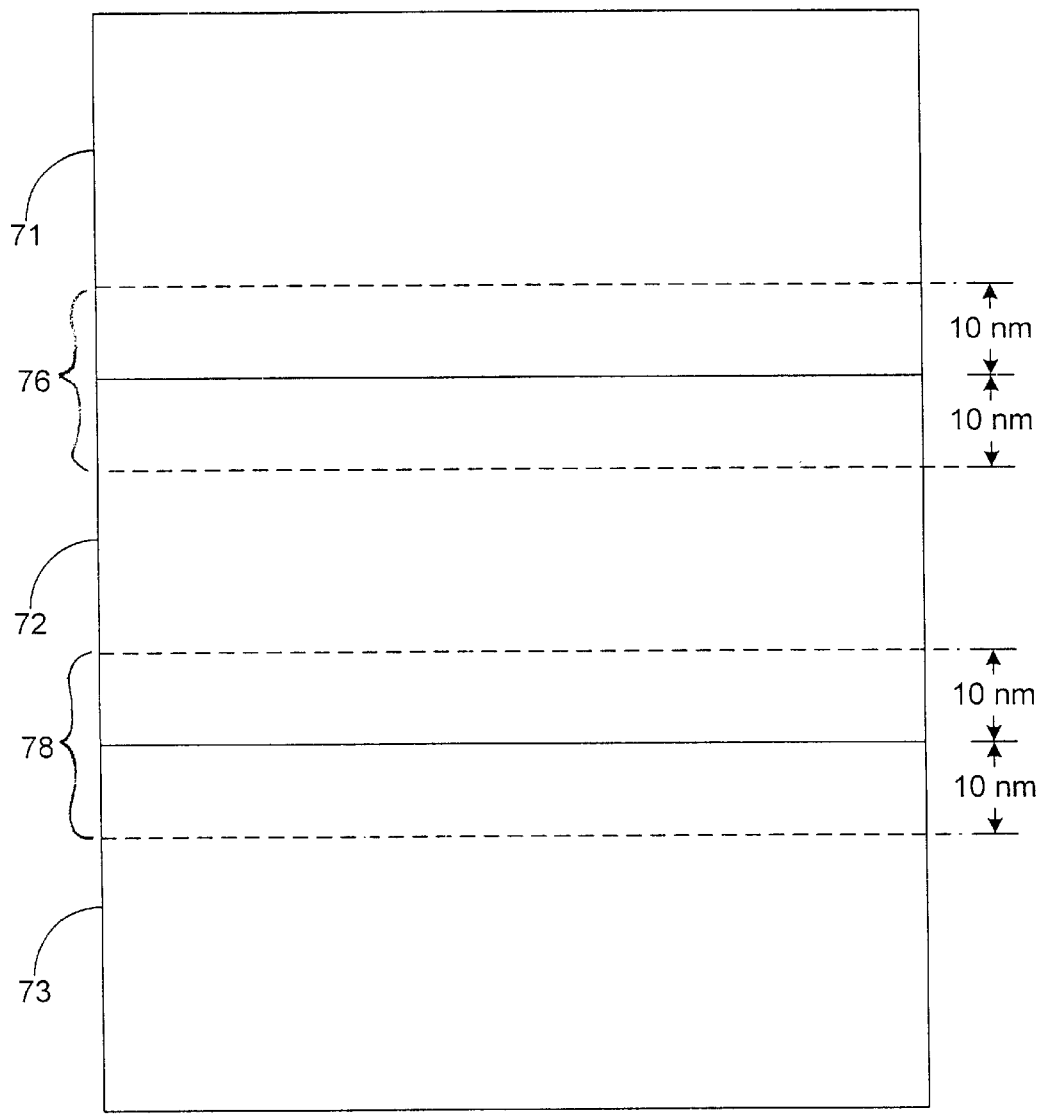
FIG. 5B is a block diagram illustrating the layers of FIG. 5A after intermetallics have been formed in the layers.

In this regard, intermetallics form at the interface of layers 61–65. Therefore, intermetallics usually form only a certain distance into each layer 61–65. As an example refer to FIG. 5A, which depicts exemplary layers 71, 72, and 73. Assume that intermetallics are formed approximately 10 nanometers (nm) into each layer from the boundary of the layer based on the types of material comprising layers 71–73 and the type of annealing process utilized. Therefore, when the layers 71–73 are annealed, intermetallics form at the interfaces of the layers 71–73 as shown by FIG. 5B. In FIG. 5B, the areas 76 and 78 indicate which portions of layers 71–73 include intermetallics. Because the thickness of each layer 71, 72, or 73 is greater than 20 nm, portions of the layers 71–73 do not include the formation of intermetallics.

Figure 6:
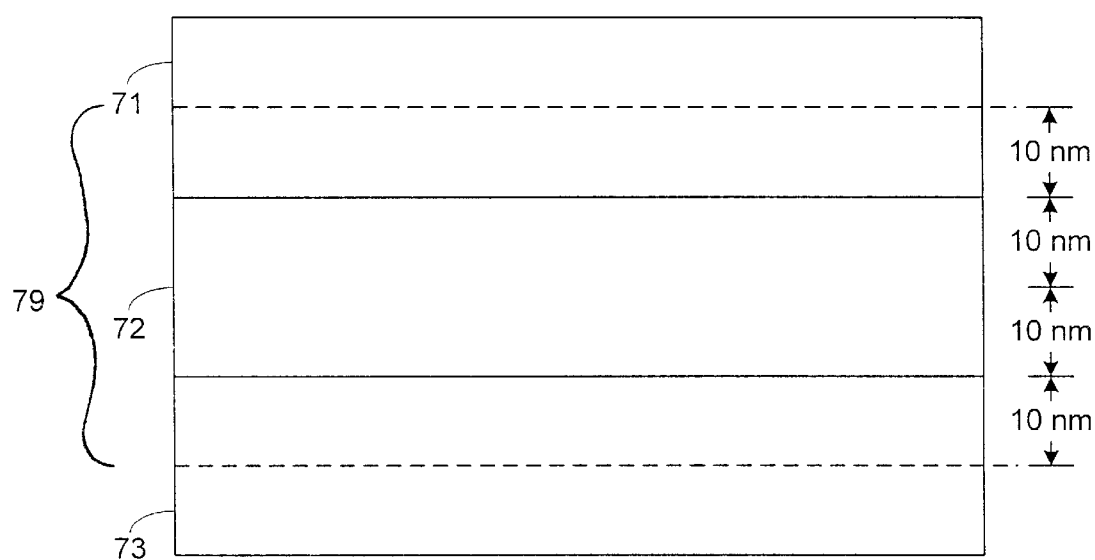
FIG. 6 is a block diagram illustrating the layers of FIG. 5B after reducing the thickness of the layers.

However, if the thickness of each layer 71–73 is reduced to 20 nm, then the entire portion of the interior layer 72 should include intermetallics, as shown by FIG. 6. In FIG. 6, area 79 indicates which portions of layers 71–73 include intermetallics. As used hereafter, the term "interior layer" shall refer to one of the layers of barrier 60 which do not contact either wetting layer 35 or compliant layer 23. As an example, layers 62–64 of FIG. 4 are interior layers. Since it is desirable to have at least one interior layer 62–64 with intermetallics formed throughout to maximize the effect of implementing the present invention, the barrier layer 60 should include at least three layers (e.g., layer 61, layer 65, and one of the interior layers 62–64) within the barrier layer 60, although any number greater than three is possible.

Therefore, it is desirable for the thickness of each layer 61–65 to be much smaller than the thickness of conventional barrier layer 27. Since intermetallics typically form within 10 nm of layer boundaries for most annealing processes, it is preferable that the thickness of each interior layer 62–64 be less than approximately 20 nm and for the thickness of each outer layer 61 and 65 to be less than approximately 10 nm. Keeping the thickness of the layers 61–65 within these ranges should maximize the formation of the intermetallics throughout the barrier layer 60 for a given thickness of the barrier layer 60. However, it should be noted that the thickness of each interior layer 62–64 can be greater than 20 nm and that the thickness of each outer layer 61 and 65 can be greater than 10 nm, but this may result in the absence of intermetallics in portions of the barrier layer 60. As a result, fewer intermetallics may be dispersed throughout the barrier layer 60 for a given thickness of the barrier layer 60, resulting in a weaker bond between the layers 61–65. Consequently, although the robustness of the barrier layer 60 is improved by increasing the number of layers 61–65 of the barrier layer 60 to three or more, the amount of intermetallics and, therefore, the effectiveness of the barrier layer 60 is not maximized unless the thickness of each of the layers 61–65 is chosen such that intermetallics form completely throughout each layer 61–65.

After barrier layer 60 has been formed, wetting layer 35 is formed on the barrier layer 60. In the preferred embodiment, the wetting layer 35 is comprised of gold (Au), although other elements or compounds may be used. Bonding material, such as a gold-tin (Au—Sn) solder, is then applied to the wetting layer 35, and the submount 31 is bonded to the assembly 50 according to conventional bonding techniques. However, it is difficult for the bonding material to break the strong chemicals bonds formed in the barrier layer 60. Therefore, the barrier layer 60 resists dissolving with the bonding material and protects the underlying compliant layer 23 from contamination by the bonding material better than conventional barrier layer 27. As a result, the bonding process that attaches the submount 31 to the assembly 50 can utilize higher temperatures and/or longer bonding durations without contaminating the compliant layer 23.

It should be noted that other elements and/or compounds may be used in place of the elements described herein. In particular, other elements of low electronegativity that may be used in place of the titanium (Ti) in barrier layer 60 include, but are not limited to, ytterbium (Y), Lanthanum (La), and cerium (Ce), and other elements of high electronegativity that may be used in place of the platinum (Pt) include, but are not limited to, nickel (Ni), cobalt (Co), palladium (Pd), and rhodium (Rh).

Furthermore, as set forth hereinabove, it is not necessary for alternating layers 61–65 of barrier layer 60 to be comprised of the same element. However, to increase the strength of the bonds between layers 61–65, it is desirable for alternating layers of layers 61–65 to have significantly different electronegativities. As used herein, the phrase "significantly different electronegativities" shall be defined as electronegativities having a Pauling electronegativity value difference of approximately 0.3 or greater. For example, the material of layer 62 should be selected such that a value of approximately 0.3 or greater is calculated when the Pauling electronegativity value of the material of layer 62 is subtracted from either the Pauling electronegativity value of the material of layer 61 or the Pauling electronegativity value of the material of layer 63. Any materials that produce significantly different electronegativities for alternating layers 61–65 of the barrier layer 60 are suitable for implementing the principles of the present invention.

It should be further noted that the preferred embodiment of the present invention has been discussed hereinabove in the context of a semiconductor laser assembly 50. However, the principles of the present invention can be applied to any microfabricated device when it is desirable to have a barrier layer 60 to prevent contamination of underlying layers (i.e., layers, such as the compliant layer 23, that are underneath the barrier layer 60) and/or the bonding layer 33. In this regard, semiconductor laser 19 is not a necessary part of the present invention, and the compliant layer 23 and barrier layer 60 of FIG. 4 can be formed on any substrate comprising various layer(s) and/or device(s). Furthermore, it may be desirable to maintain the purity of layers other than the compliant layer 23. Therefore, the compliant layer 23 does not form a necessary part of the present invention, and the barrier layer 60 may be used to protect other types of layers disposed underneath the barrier layer 60 (i.e., disposed on a side of the barrier layer 27 opposite of the bonding layer 33).

In concluding the detailed description, it should be noted that it will be obvious to those skilled in the art that many variations and modifications may be made to the preferred embodiment without substantially departing from the principles of the present invention. All such variations and modifications are intended to be included herein within the scope of the present invention, as set forth in the following claims.

Now, therefore, the following is claimed:

1. A microfabricated device, comprising:
   a substrate;
   a multi-layer barrier, said multi-layer barrier including a first layer coupled to a second layer, a third layer coupled to the second layer, a fourth layer coupled to the third layer, a fifth layer coupled to the fourth layer, wherein the first, third, and fifth layers have a different electronegativity relative to said second and fourth layers, wherein the first, second, third, fourth and fifth layers are annealed to the extent that interfaces of the layers are fused together and include intermetallics comprised of a first element and a second element, wherein the first element has a relatively low electronegativity and the second element has a relatively high electronegativity;
   a compliant layer coupled to said fifth layer and said substrate, wherein said compliant layer comprises gold; and
   bonding material disposed on said first layer.

2. The device of claim 1, wherein said compliant layer is an electrically conductive layer.

3. The device of claim 1, wherein said compliant layer is a thermally conductive layer.

4. The device of claim 1, wherein a thickness of each of said layers within said multi-layer barrier is less than approximately 20 nanometers (nm).

5. The device of claim 1, wherein said first, third, and fifth layers have a high electronegativity relative to said second and fourth layers.

6. The device of claim 1, wherein said first, third, and fifth layers have a low electronegativity relative to said second and fourth layers.

7. The device of claim 1, wherein said third layer is associated with an electronegativity significantly different than said electronegativity associated with said second layer.

8. The device of claim 7, wherein said third layer is associated with an electronegativity significantly different than said electronegativity associated with said second layer.

9. The device of claim 8, wherein a thickness of said second layer is less than approximately 20 nanometers (nm).

10. The device of claim 9, wherein a thickness of said first layer is less than approximately 10 nanometers (nm).

11. The microfabricated device of claim 1, wherein said first, third, and fifth layers are chosen from nickel, cobalt, and palladium.

12. The microfabricated device of claim 1, wherein said second and fourth layers are chosen from nickel, cobalt, and palladium.

13. The microfabricated device of claim 1, wherein said first, third, and fifth layers are chosen from lanthanide rare earth elements.

14. The microfabricated device of claim 1, wherein said second and fourth layers are chosen from lanthanide rare earth elements.

15. A microfabricated device, comprising:
    a substrate;
    a multi-layer barrier, said multi-layer barrier including a first layer coupled to a second layer, a third layer coupled to the second layer, a fourth layer coupled to the third layer, a fifth layer coupled to the fourth layer, wherein the first, third, and fifth layers have a different electronegativity relative to said second and fourth layers;
    a compliant layer coupled to said fifth layer and said substrate, wherein said compliant layer is gold; and
    bonding material disposed on said first layer.

16. For use in a microfabricated device having a semiconductor device coupled to a gold layer subject to contamination by a bonding layer, a barrier layer between the gold layer and the bonding layer, said barrier layer comprising:
    a second layer coupled to said bonding layer;
    a third layer diffused with said second layer, said third layer having intermetallics formed throughout;
    a fourth layer diffused with said third layer, said fourth layer having intermetallics formed throughout;
    a fifth layer diffused with said fourth layer, said fifth layer having intermetallics formed throughout; and
    a sixth layer diffused with said fifth layer, wherein the first, second, third, fourth and fifth layers are annealed to the extent that interfaces of the layers are fused together and include intermetallics comprised of a first element and a second element, wherein the first element has a relatively low electronegativity and the second element has a relatively high electronegativity, wherein said bonding layer is coupled to the gold layer.

17. The barrier layer of claim 16, wherein each of said layers comprising said barrier layer is less than approximately 20 nanometers (nm).

18. The barrier layer of claim 16, wherein said second layer is associated with a high electronegativity, said third layer is associated with a low electronegativity, and said fourth layer is associated with a high electronegativity.

19. The barrier layer of claim 16, wherein said second layer is associated with a low electronegativity, said third layer is associated with a high electronegativity, and said fourth layer is associated with a low electronegativity.

20. The barrier layer of claim 16, wherein said third layer is associated with an electronegativity significantly different than electronegativities associated with said second layer and said fourth layer.

21. The microfabricated device of claim 16, wherein said second, fourth, and six layers are chosen from nickel, cobalt, and palladium.

22. The microfabricated device of claim 16, wherein said third and fifth layers are chosen from nickel, cobalt, and palladium.

23. The microfabricated device of claim 16, wherein said second, fourth, and six layers are chosen from lanthanide rare earth elements.

24. The microfabricated device of claim 16, wherein said third and fifth layers are chosen from lanthanide rare earth elements.

* * * * *

UNITED STATES PATENT AND TRADEMARK OFFICE
CERTIFICATE OF CORRECTION

PATENT NO. : 6,590,913 B1
DATED : July 8, 2003
INVENTOR(S) : Caras et al.

It is certified that error appears in the above-identified patent and that said Letters Patent is hereby corrected as shown below:

<u>Column 2,</u>
Line 33, delete "manu-facturing" and replace with -- manufacturing --.

<u>Column 6,</u>
Line 42, delete "chemicals" and replace with -- chemical --.

<u>Column 8,</u>
Line 26, delete "third" and replace with -- first --.

Signed and Sealed this

Thirtieth Day of September, 2003

JAMES E. ROGAN
*Director of the United States Patent and Trademark Office*